United States Patent
Ramesh

(10) Patent No.: US 10,103,917 B2
(45) Date of Patent: Oct. 16, 2018

(54) PEAK TO AVERAGE POWER RATIO REDUCTION IN MULTICHANNEL DIGITAL FRONT-ENDS (DFES)

(71) Applicant: MaxLinear, Inc., Carlsbad, CA (US)

(72) Inventor: Sridhar Ramesh, Irvine, CA (US)

(73) Assignee: MAXLINEAR, INC., Carlsbad, CA (US)

( * ) Notice: Subject to any disclaimer, the term of this patent is extended or adjusted under 35 U.S.C. 154(b) by 0 days.

(21) Appl. No.: 15/425,115

(22) Filed: Feb. 6, 2017

(65) Prior Publication Data

US 2017/0230221 A1 Aug. 10, 2017

Related U.S. Application Data

(60) Provisional application No. 62/291,785, filed on Feb. 5, 2016.

(51) Int. Cl.
| | |
|---|---|
| *H03D 1/04* | (2006.01) |
| *H03K 5/01* | (2006.01) |
| *H04B 1/10* | (2006.01) |
| *H04L 25/08* | (2006.01) |
| *H04L 27/26* | (2006.01) |
| *H03D 3/00* | (2006.01) |
| *H04B 15/00* | (2006.01) |
| *H03D 1/06* | (2006.01) |

(52) U.S. Cl.
CPC ........... *H04L 27/2621* (2013.01); *H03D 1/06* (2013.01); *H03D 3/002* (2013.01); *H04B 1/1027* (2013.01); *H04B 15/00* (2013.01); *H04L 27/2601* (2013.01)

(58) Field of Classification Search
USPC .......... 375/219, 220, 229–236, 240, 240.26, 375/240.27, 240.29, 254, 267, 278, 285, 375/284, 296, 324, 340, 346, 348, 350
See application file for complete search history.

(56) References Cited

U.S. PATENT DOCUMENTS 7,313,195 B2 * 12/2007 Chen ................... H04L 27/2614
 375/286
8,036,285 B2 * 10/2011 Awad .................. H04L 27/2621
 370/203

(Continued)

*Primary Examiner* — Linda Wong
(74) *Attorney, Agent, or Firm* — McAndrews, Held & Malloy, Ltd.

(57) ABSTRACT

Systems and methods are provided for peak to average power ratio (PAPR) reduction in multichannel digital front-ends (DFEs). A transmitter may be configured to reduce PAPR during multichannel transmission, with the reducing comprising: generating a plurality of frequency-domain symbols, each of which corresponding to a particular one of a plurality of subcarriers; assigning the subcarriers to a plurality of channels, wherein a number of channels is less than a number of subcarriers; and generating a plurality of time-domain signals corresponding to the channels. An adjustment to reduce PAPR may be applied to at least one of the time-domain signals, with the adjustment being based on symbols boundaries. The adjustment may comprise sign inversion. Adjusted and unadjusted waveforms may be generated for two or more of the time-domain signals; and selection may be made between generated adjusted waveforms based on particular criteria. The criteria may comprise lowest peak.

18 Claims, 8 Drawing Sheets

(56) References Cited

U.S. PATENT DOCUMENTS

| | | | |
|---|---|---|---|
| 8,223,860 B2* | 7/2012 | Har | H04L 27/2621 375/259 |
| 9,083,592 B2* | 7/2015 | Lim | H04L 27/2615 |
| 2003/0202460 A1* | 10/2003 | Jung | H04L 27/2621 370/208 |
| 2004/0146115 A1* | 7/2004 | Feng | H04L 1/0041 375/260 |
| 2006/0193393 A1* | 8/2006 | Shen | H04L 27/2621 375/260 |
| 2006/0286946 A1* | 12/2006 | Akkarakaran | H04L 27/2624 455/101 |
| 2007/0189334 A1* | 8/2007 | Awad | H04L 27/2621 370/491 |
| 2007/0211807 A1* | 9/2007 | Han | H04L 27/2621 375/260 |
| 2008/0075195 A1* | 3/2008 | Pajukoski | H04L 5/0016 375/298 |
| 2008/0279292 A1* | 11/2008 | Tanabe | H04L 5/0051 375/260 |
| 2009/0052577 A1* | 2/2009 | Wang | H04L 1/009 375/299 |
| 2009/0296564 A1* | 12/2009 | Kwon | H04L 27/2621 370/210 |
| 2009/0310658 A1* | 12/2009 | Garg | H04M 11/062 375/222 |
| 2010/0091900 A1* | 4/2010 | Gan | H04L 27/2614 375/267 |
| 2010/0110875 A1* | 5/2010 | No | H04L 27/2621 370/210 |
| 2011/0228878 A1* | 9/2011 | Sorrentino | H04L 5/0007 375/295 |
| 2012/0093248 A1* | 4/2012 | Kwon | H04L 27/2621 375/261 |
| 2013/0058440 A1* | 3/2013 | Rajagopal | H04L 25/0226 375/340 |
| 2013/0322563 A1* | 12/2013 | Van Zelst | H04L 27/2621 375/295 |
| 2015/0372843 A1* | 12/2015 | Bala | H04L 25/03834 375/295 |
| 2016/0011296 A1* | 1/2016 | Keegan | H04L 27/2601 370/252 |
| 2016/0112238 A1* | 4/2016 | Ling | H04B 10/50 375/261 |

* cited by examiner

PEAK TO AVERAGE POWER RATIO REDUCTION IN MULTICHANNEL DIGITAL FRONT-ENDS (DFES)

CLAIM OF PRIORITY

This patent application makes reference to, claims priority to and claims benefit from U.S. Provisional Patent Application Ser. No. 62/291,785, filed Feb. 5, 2016. The above identified application is hereby incorporated herein by reference in its entirety.

TECHNICAL FIELD

Aspects of the present disclosure relate to communications. More specifically, certain implementations of the present disclosure relate to methods and systems for a peak to average power ratio reduction in multichannel digital front-ends (DFEs).

BACKGROUND

Various issues may exist with conventional approaches for managing power in communication systems. For example, high peak to average power ratios can have negative impacts on the cost and operation of electronic receivers. Conventional approaches for managing peak to average power ratios may be costly, cumbersome, and/or inefficient. In this regard, conventional systems and methods, if any existed, for handling adverse effects (e.g., noise, distortion, interference, etc.) in transmit bands may be costly and/or inefficient.

Further limitations and disadvantages of conventional and traditional approaches will become apparent to one of skill in the art, through comparison of such systems with some aspects of the present disclosure as set forth in the remainder of the present application with reference to the drawings.

BRIEF SUMMARY

System and methods are provided for a peak to average power ratio reduction in multichannel digital front-ends (DFEs), substantially as shown in and/or described in connection with at least one of the figures, as set forth more completely in the claims.

These and other advantages, aspects and novel features of the present disclosure, as well as details of an illustrated embodiment thereof, will be more fully understood from the following description and drawings.

DETAILED DESCRIPTION OF THE INVENTION

As utilized herein the terms "circuits" and "circuitry" refer to physical electronic components (e.g., hardware) and any software and/or firmware ("code") which may configure the hardware, be executed by the hardware, and or otherwise be associated with the hardware. As used herein, for example, a particular processor and memory may comprise a first "circuit" when executing a first one or more lines of code and may comprise a second "circuit" when executing a second one or more lines of code. As utilized herein, "and/or" means any one or more of the items in the list joined by "and/or". As an example, "x and/or y" means any element of the three-element set $\{(x), (y), (x, y)\}$. In other words, "x and/or y" means "one or both of x and y." As another example, "x, y, and/or z" means any element of the seven-element set $\{(x), (y), (z), (x, y), (x, z), (y, z), (x, y, z)\}$. In other words, "x, y and/or z" means "one or more of x, y, and z." As utilized herein, the term "exemplary" means serving as a non-limiting example, instance, or illustration. As utilized herein, the terms "for example" and "e.g.," set off lists of one or more non-limiting examples, instances, or illustrations. As utilized herein, circuitry is "operable" to perform a function whenever the circuitry comprises the necessary hardware and code (if any is necessary) to perform the function, regardless of whether performance of the function is disabled or not enabled (e.g., by a user-configurable setting, factory trim, etc.).

Figure 1:
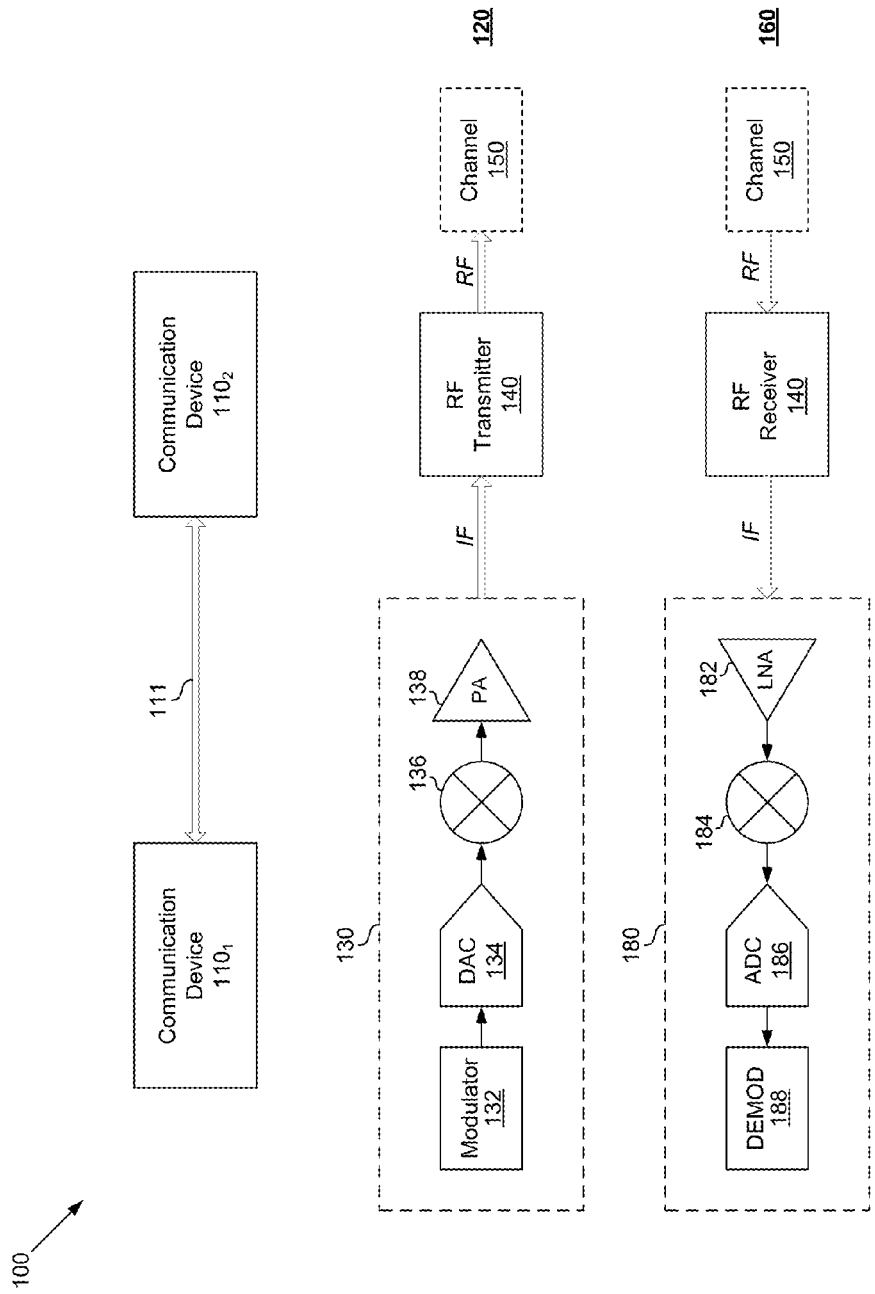
FIG. 1 illustrates an example communication arrangement multichannel communications may be used.

FIG. 1 illustrates an example communication arrangement multichannel communications may be used. Shown in FIG. 1 is a communication arrangement 100, comprising communication devices $110_1$ and $110_2$, which may communicate via a connection/link 111.

Each of the communication devices $110_1$ and $110_2$ may comprise suitable circuitry for communication over wired and/or wireless connections, such as during executing, running, and/or performing of operations, functions, applications, and/or services in one or both of the communication devices $110_1$ and $110_2$. For example, the communication devices 100 may be configured to support (e.g., using suitable dedicated communication components or subsystems) use of wired and/or wireless connections/interfaces, which may be configured in accordance with one or more supported wireless and/or wired protocols or standards, to facilitate transmission and/or reception of signals (carrying data) to and/or from the communication devices 100. In this regard, the communication devices 100 may be operable to perform necessary processing operations to facilitate transmission and/or reception of signals (e.g., RF signals) over supported wired and/or wireless interfaces.

Examples of wireless standards, protocols, and/or interfaces which may be supported and/or used by the communication devices $110_1$ and $110_2$ for communication therebetween may comprise wireless personal area network (WPAN) protocols (e.g., as Bluetooth (IEEE 802.15) and ZigBee), near field communication (NFC) standards, wireless local area network (WLAN) protocols (e.g., such as WiFi (IEEE 802.11) standards), cellular standards (including 2G/2G+, such as GSM/GPRS/EDGE, IS-95 or cdmaOne, etc., and 3G/3G+, such as CDMA2000, UMTS, and HSPA, etc.), 4G standards (e.g., WiMAX (IEEE 802.16) and LTE), Ultra-Wideband (UWB), Extremely High Frequency (EHF, such as 60 GHz) Digital TV Standards (e.g., DVB-T/DVB-H, and ISDB-T), etc.

Examples of wireless standards, protocols, and/or interfaces which may be supported and/or used by the communication devices $110_1$ and $110_2$ for communication therebetween may comprise Ethernet (IEEE 802.3), Digital Subscriber Line (DSL), Integrated Services Digital Network (ISDN), Fiber Distributed Data Interface (FDDI), cable television and/or internet access standards (e.g., ATSC, DVB-C, DOCSIS, etc.), in-home distribution standards such as Multimedia over Coax Alliance (MoCA), Universal Serial Bus (USB) based standards/protocols/interfaces, etc.

Examples of signal processing operations that may be performed by the electronic system 100 may comprise, for example, one or more of filtering, amplification, analog-to-digital conversion, digital-to-analog conversion, up-conversion, down-conversion, encoding, decoding, encryption, decryption, modulation, demodulation, etc.

Accordingly, each of communication devices 100 may correspond to (at least portion of) such electronic devices as cellular and smart phones or similar handheld devices, tablets, personal computers, laptops or notebook computers, servers, personal media players, personal digital assistants, set top boxes, satellite receivers, wireless access points, cellular base stations, etc. The disclosure is not limited, however, to particular type of systems, and similar solutions as those described in this disclosure may apply to any suitable system where similar issues (e.g., nonlinearity) are encountered.

In operation, the communication devices $110_1$ and $110_2$ may communicate over the connection/link 111. The connection/link 111 may be unidirectional (e.g., allow for communications in only one direction, such as from the communication device $110_1$ to the communication device $110_2$), or may be bidirectional (e.g., allowing for communications in both directions—that is, from the communication device $110_1$ to the communication device $110_2$, and from the communication device $110_2$ to the communication device $110_1$). In this regard, the connection/link 111 may be configured to allow for concurrent bidirectional communications between the two devices (e.g., using time division duplex (TDD), frequency division duplex (FDD) simultaneous transmit and receive (STR), etc.).

Communications over the connection/link 111 may comprise transmission and reception of signals (e.g., RF signals), which may be utilized to carry data communicated between the communication devices $110_1$ and $110_2$. The signals communicated over the connection/link 111 may be setup, configured, and/or utilized in accordance with corresponding wired and/or wireless interfaces, protocols, and/or standards. The communication devices $110_1$ and $110_2$ may comprise suitable components configured to perform various functions or operations to facilitate the transmission and reception of signals, particularly RF signals. A simplified RF transmission and reception model is illustrated in FIG. 1.

At the transmitter-side 120, a transmission (Tx) processing path 130 may be used to generate intermediate frequency (IF) signals. The Tx processing path 130 may comprise suitable circuitry for generating the IF signals, such as based on digital input (data) that is intended to be carried and/or embedded in the communicated signals. The Tx processing path 130 may comprise, for example, a modulation circuit 132, a digital-to-analog converter (DAC) circuit 134, a mixer circuit 136, and a power amplifier circuit 138. The IF signals may then be sent to a RF transmitter 140, which may comprise suitable circuitry for generating and transmitting radio frequency (RF) signals, such as based on IF signals provided thereto. The RF signals are then communicated over a RF channel 150.

At the receiver-side 160, the RF signals may be received from the channel 150 via a RF receiver 170, which may comprise suitable circuitry for receiving radio frequency (RF) signals, and processing them to generate corresponding intermediate frequency (IF) signals. The IF signals are then sent to a reception (Rx) processing path 180, which may comprise suitable circuitry for processing IF signals, such as to extract data carried and/or embedded therein (e.g., the digital data embedded into the RF signals at the transmitter-side). The Rx processing path 180 may comprise, for example, low-noise amplifier (LNA) circuit 182, a mixer circuit 184, digital-to-analog converter (DAC) circuit 186, and a demodulator circuit 132.

In some instances, communication of signals may comprise use of multichannel transmissions. For example, the communication arrangement 100 may be configured to support multichannel transmission based on orthogonal frequency division multiplexing (OFDM). In this regard, orthogonal frequency division multiplexing (OFDM) is a frequency-division multiplexing (FDM) scheme for communicating digital data encoded on multiple carrier frequencies. In particular, a large number of closely spaced orthogonal sub-carriers may be used to carry data on several parallel data streams or channels. Each sub-carrier may be modulated with a conventional modulation scheme (e.g., quadrature amplitude modulation (QAM), phase-shift keying (PSK), etc.) at a low symbol rate, thus maintaining total data rates similar to conventional single-carrier modulation schemes in the same bandwidth.

An example implementation of a transmitter supporting use of OFDM based transmissions, and incorporating various measures for enhancing such transmissions, is described below with respect to FIG. 2.

Figure 2:
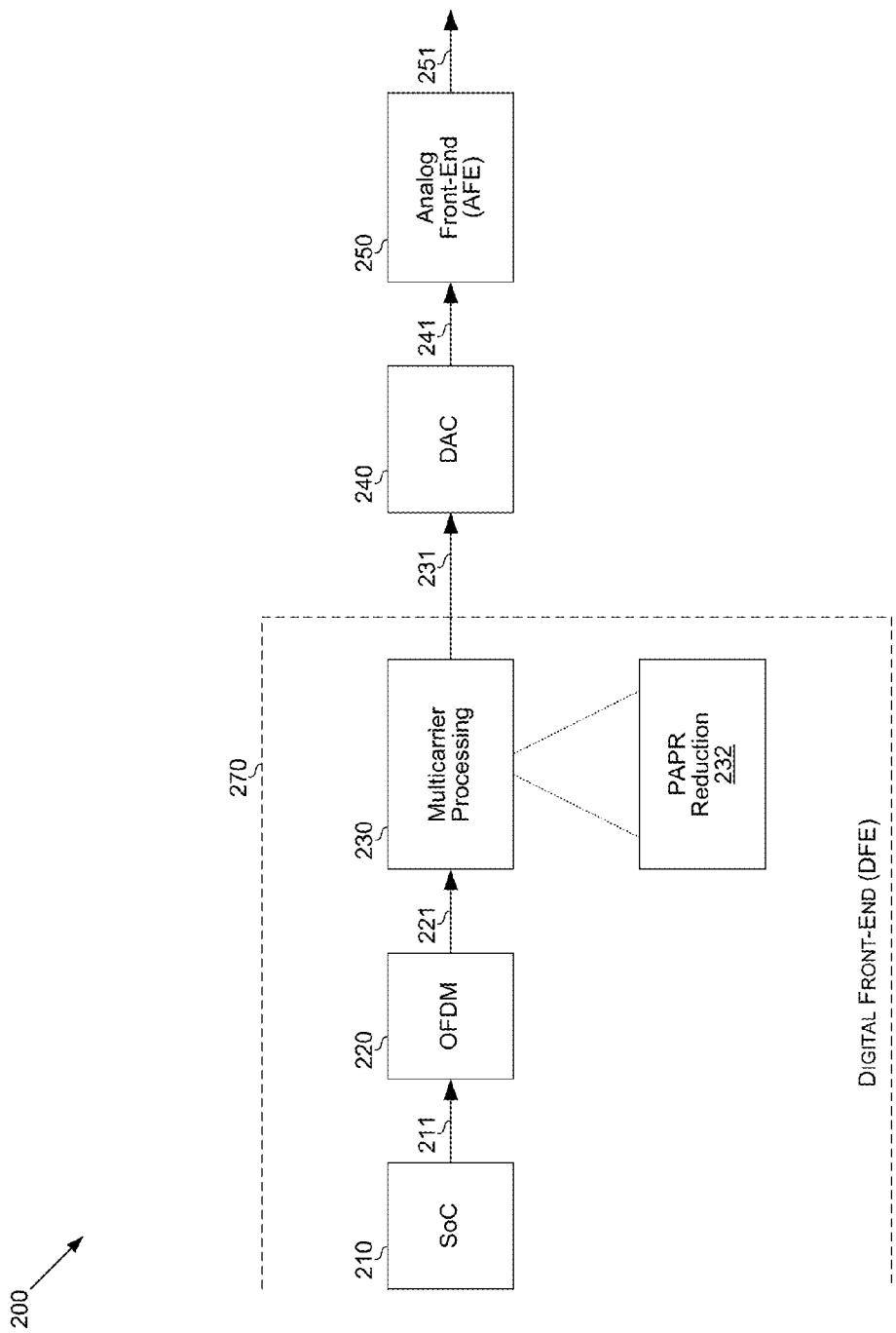
FIG. 2 illustrates an example transmitter operable to perform peak to average power ratio (PAPR) reduction in multichannel digital front-ends (DFEs).

FIG. 2 illustrates an example transmitter operable to perform peak to average power ratio (PAPR) reduction in multichannel digital front-ends (DFEs). Shown in FIG. 2 is an example transmitter 200.

The transmitter 200 may comprise suitable circuitry for implementing various aspects of the present disclosure. In this regard, the transmitter 200 may comprise suitable circuitry for facilitating transmission of signals, particularly multichannel based transmission. For example, the transmitter 200 may be operable to support multichannel transmission based on orthogonal frequency division multiplexing (OFDM). In this regard, as shown in FIG. 2, the transmitter 200 may comprise a system on chip (SoC) 210, an orthogonal frequency division multiplexing (OFDM) circuit 220, a multicarrier processing circuit 230, a digital-to-analog converter (DAC) 240, and an analog front-end (AFE) circuit 250. In this regard, the components of the transmitter 200 preceding the DAC 240 may be referred as a digital front-end (DFE) 270 of the transmitter 200.

A bitstream output 211 by the system on chip (SoC) 210 is input to the OFDM circuit 220, which generates a corresponding OFDM mapping output 221. The OFDM mapping output 221 may then be processed via the multicarrier processing circuit 230. For example, the OFDM circuit 220 may maps the bitstream 211 into a plurality (e.g., J*K) quadrature amplitude modulation (QAM) symbols, corresponding to same number (e.g., J*K) of OFDM subcarriers (a frequency-domain representation of an OFDM symbol). In this regard, in an example use scenario, the subcarriers may be grouped, such as into a number of sub-bands (or channels).

For example, the J*K subcarriers may be grouped into K sub-bands (channels) of J subcarriers in each sub-band (channel). In this regard, the subcarriers may be distributed uniformly among the sub-bands. The disclosure is not so limited, however, and in some implementations the subcarriers may be non-uniformly distributed among the sub-bands (e.g., each of the K sub-bands may have any number of subcarriers which may be different from any other of the sub-bands).

Further, subcarriers grouped into a particular sub-band need not be adjacent to one another. For example, subcarriers that are spaced apart in frequency may be grouped into a common sub-band because the subcarriers share certain characteristics in the frequency domain and/or in the time domain.

The processing performed in the multicarrier processing circuit 230 may comprise applying inverse fast Fourier transform (IFFT). In this regard, applying IFFT results in a set of complex time-domain samples. Processing may further comprise upsampling, interpolation, etc. Where subcarriers are grouped into a number of sub-bands, each of the sub-bands may be subject to full-resolution (e.g., X bits) that operates on that sub-band. Thus, the output of processing the input bitstream 211 may be a plurality (e.g., K) of time-domain signals.

These time-domain samples (signals) may be used in modulating corresponding transmission carrier (e.g., RF) signal(s). In this regard, time-domain signals (131) may be converted to the analog signal(s) via the DAC 240, and the corresponding analog signal(s) 241 are then input into the AFE 250, which uses the analog signal(s) in modulating the carrier frequencies.

In various implementations, the transmitter 200 may be configured to incorporate low complexity peak to average power ratio (PAPR) reduction. This may be done by incorporating dedicated circuitry—e.g., a PAPR reduction circuit 232. The PAPR reduction circuit 232 may implemented as a dedicated and separate component, or as part (e.g., by incorporating circuits corresponding thereto) into other components of the transmitter 200, such as the multicarrier processing circuit 230.

The PAPR reduction circuit 232 may be operable to provide and/or support low complexity PAPR reduction. In particular, sign-scrambling, inside the DFE, may be used to reduce PAPR. In this regard, sign-scrambling may be done based on (e.g., only at) symbol boundaries, rather than, e.g., for each subcarrier, as may be done in conventional solutions.

For example, the PAPR reduction circuit 232 may be synchronized OFDM symbol boundaries (e.g., using OFDM symbol synchronization signal/indication). Further, the orthogonality of OFDM signal is preserved. As noted above, with such approach (sign-scrambling at OFDM symbol boundary) complexity is low (e.g., in terms of complexity of calculations and/or required resources), with 2^Num of channels for symbol boundary based sign-scrambling compared to 2^Num of subcarriers for bin scrambling.

In certain implementations, enhanced (e.g., low complexity) solutions may be utilized to facilitating the required descrambling at the receiver-side. In this regard, descrambling information (e.g., information about the sign-scrambling applied at the transmitter-side, to enable determining and/or applying corresponding descrambling at the receiver-side) may be provided to the receiver-side in enhanced manner. For example, a low complexity signaling solution may be utilized to provide required descrambling information to the receiver-side for supporting descrambling thereat.

The descrambling information may be coded into certain carriers. For example, spare (e.g., zero-loaded) DC (Direct Current) carrier(s) in OFDM channel(s) may be used. In this regard, the DC carrier may be configured to take on the same scrambling as a corresponding channel. Use of DC carriers in this manner may provide low complexity signaling to the receiver(s) for de-scrambling.

Figure 3:
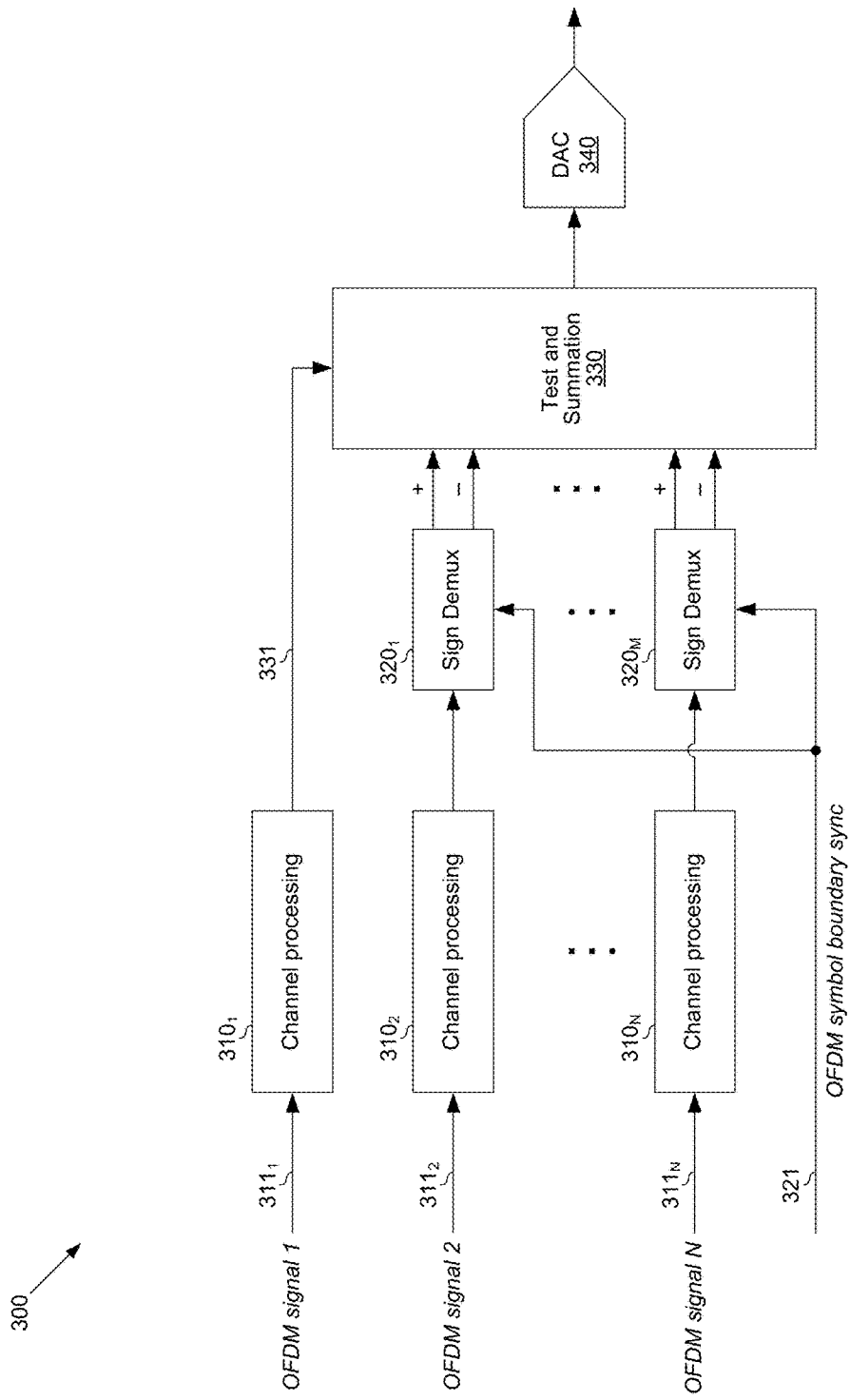
FIG. 3 illustrates example circuitry for performing peak to average power ratio (PAPR) reduction.

FIG. 3 illustrates example circuitry for performing peak to average power ratio (PAPR) reduction. Shown in FIG. 3 is circuitry 300 for providing low complexity peak to average power ratio (PAPR) reduction in a multichannel digital front-end (e.g., the transmitter 200 of FIG. 2).

The circuitry 300 may be operable to perform channel (e.g., OFDM channel) processing in a digital front-end (DFE), and to provide additionally peak to average power ratio (PAPR) reduction in conjunction with and/or based on the channel processing. For example, the circuitry 300 may correspond to PAPR reduction circuit 232 (and, optionally, a portion of the multicarrier processing circuit 230), as shown in FIG. 2.

In the example implementation illustrated in FIG. 3, the circuitry 300 may comprise a plurality of channel processing circuits 310 (e.g., N of them, or circuits $310_1$-$310_N$, as shown in FIG. 3), one or more sign demultiplexer (demux) circuits 320 (e.g., M of them, or circuits $320_1$-$320_M$, as shown in FIG. 3, where M=N−1), and a test-and-sum circuit 330. Also shown in FIG. 3 is a digital-to-analog converter (DAC) 330, which applies digital-to-analog conversions to digital signals (e.g., output(s) of the test-and-sum circuit 330).

The circuitry 300 receives a plurality of OFDM signals (e.g., OFDM signals $311_1$-$311_N$), which may be processed, respectively, via the plurality of channel processing circuits $310_1$-$310_N$. In this regard, each of the channel processing circuits $310_1$-$310_N$ may apply, for example, such processing functions as upsampling, interpolation, etc., to facilitate multichannel based (e.g., OFDM based) transmissions. Further, the circuitry 300 may perform peak to average power ratio (PAPR) reduction. In particular, the circuitry 300 may be configured to reduce PAPR by applying sign inversion only at symbol boundaries, as described with respect to FIG. 2.

In the example implementation shown in FIG. 3, the circuitry 300 may receive a control input 321 for controlling PAPR reduction related functions based on OFDM symbol boundaries—e.g., to synchronize operations of certain circuits in the circuitry 300 based on the OFDM symbol boundaries. The control input 321 may be received from other circuits (e.g., OFDM circuit 220 in the transmitter 200).

Each sign demux circuit 320 may be operable to selectively apply sign inversion to an output of one of the channel processing circuits 310. For example, each sign demux circuit 320 may create a +ve and −ve version of waveform. Determining which of the versions to output may be controlled based on the control input 321—e.g., providing the sign inverted version only at symbol boundaries. Further, each sign demux circuit 320 may also add a coding to DC carrier (e.g., by adding a stored sinusoid), to provide information to the receiver-side for determining when/if to invert sign of the channel at reception.

The outputs of the sign demux circuits (e.g., circuits $320_1$-$320_M$ in FIG. 3) may be input into the test-and-sum circuit 330. In this regard, the test-and-sum circuit 330 may select the sign inversion (flip) with lowest peak.

In an example implementation, post-processing of outputs of the sign demux circuits may be assisted by use of a reference signal. The reference signal may be a signal known not to have been subject to sign inversion. For example, one of the channels may be used as reference and as such may not be subject to sign inversion. Thus, output of one of the channel processing circuits (e.g., the channel processing circuit 310₁ in the particular example implementation shown in FIG. 3) may not pass through a corresponding sign demux circuit 320.

Figure 4A:
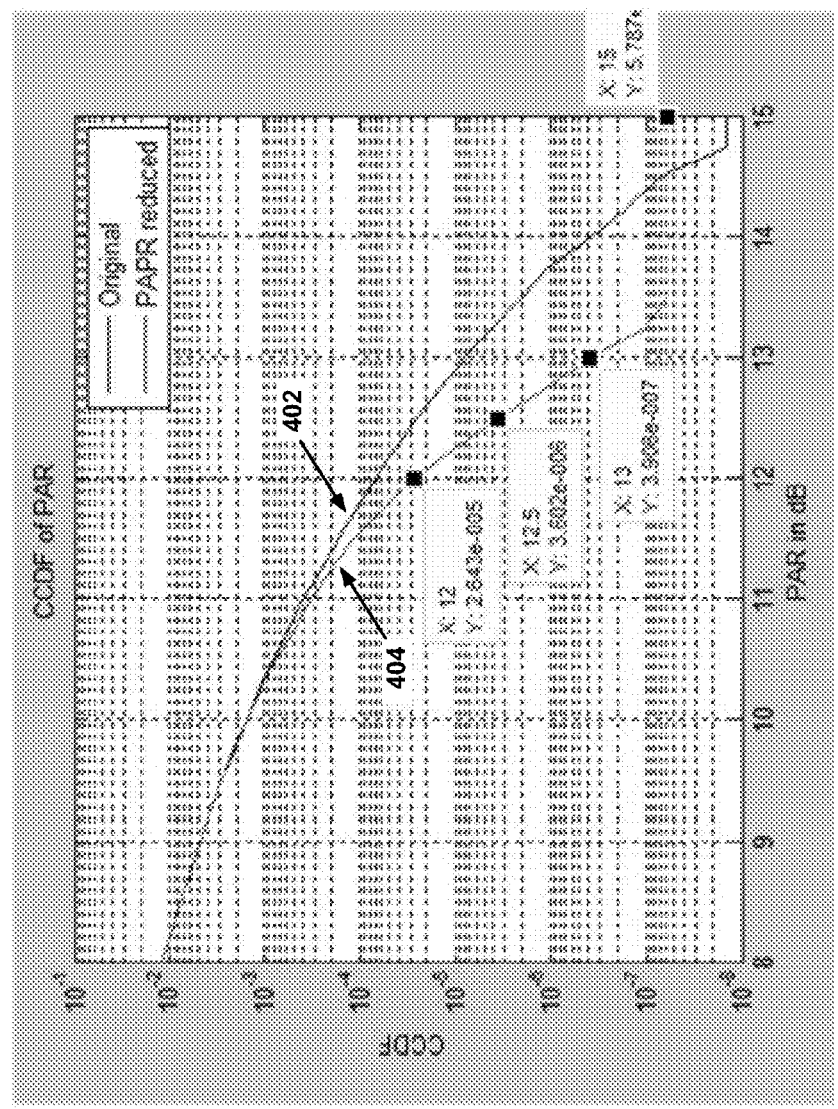
FIGS. 4A-4C illustrate example results of peak to average power ratio (PAPR) reductions in accordance with the present disclosure.
Figure 4B:
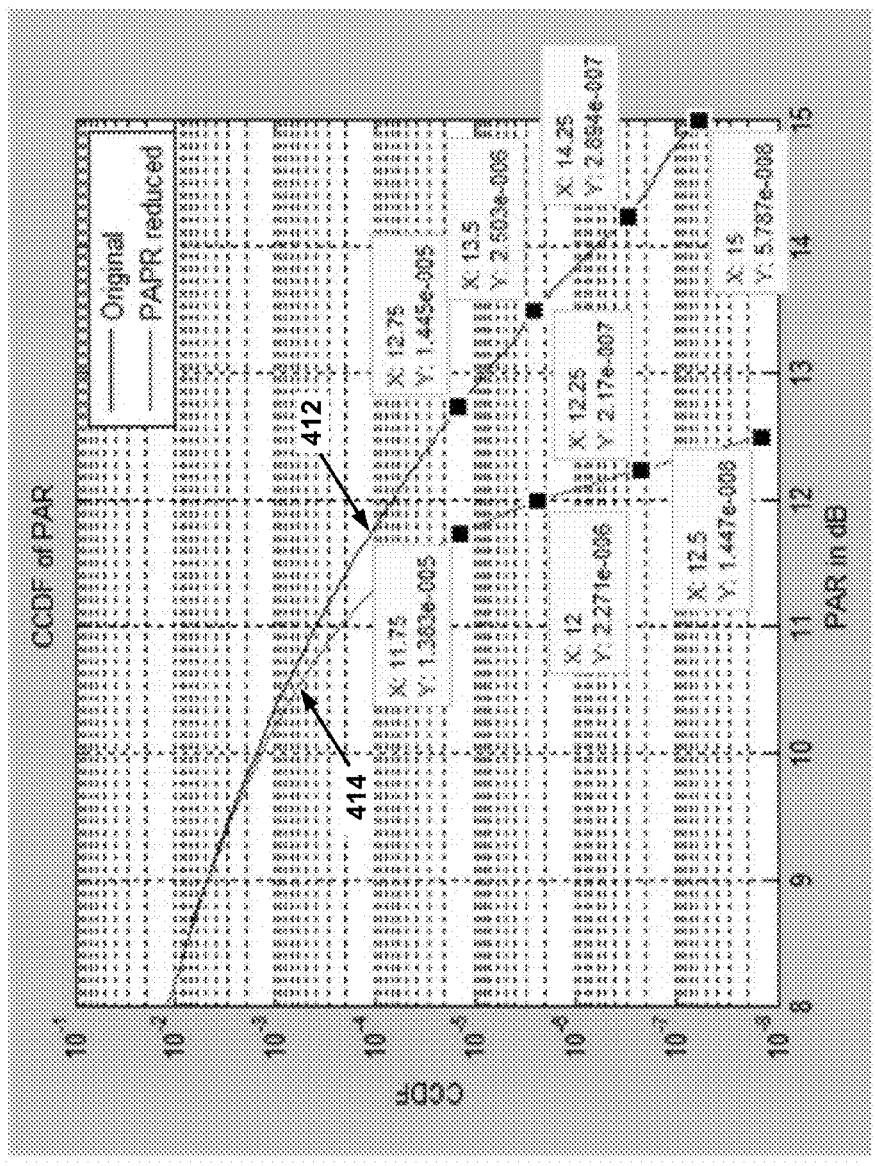
Figure 4C:
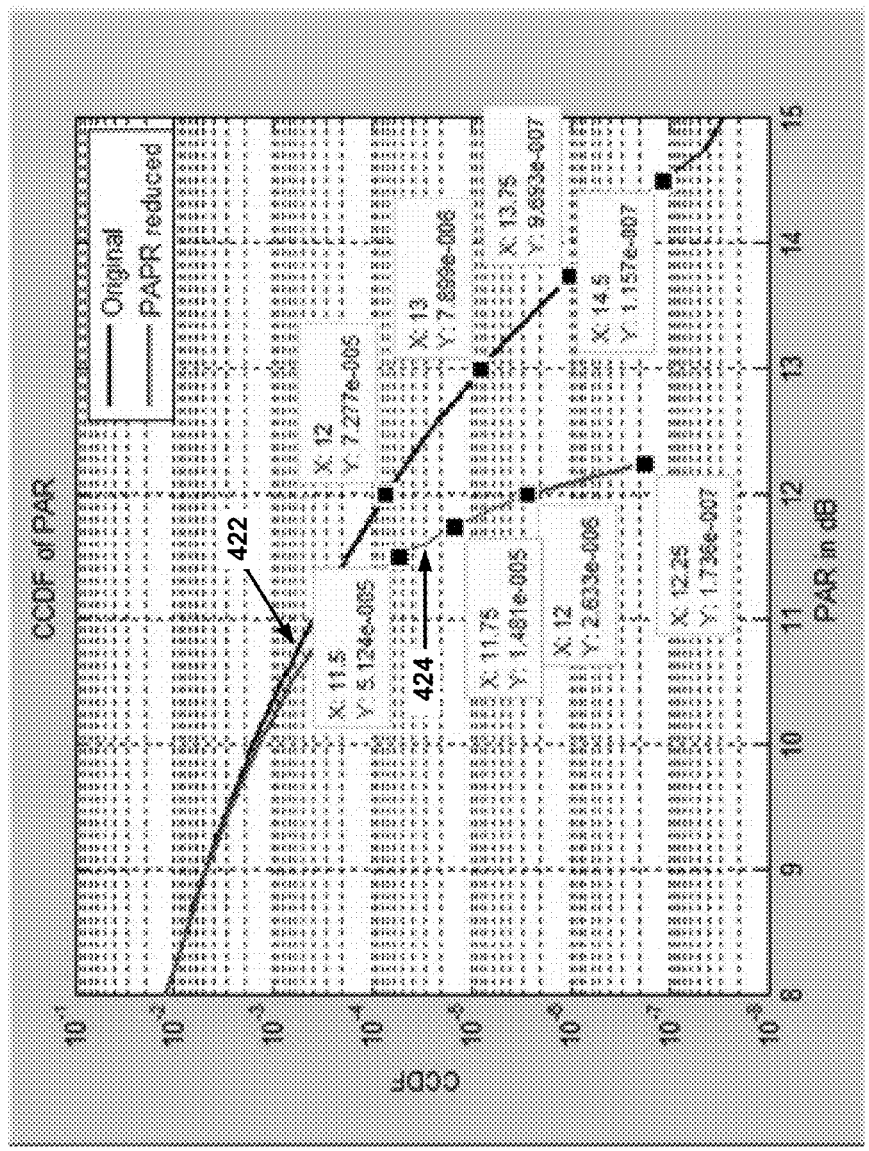

FIGS. 4A-4C illustrate example results of peak to average power ratio (PAPR) reductions in accordance with the present disclosure.

Shown in FIG. 4A is diagram 400, which depicts a complementary cumulative distribution function (CCDF) for peak to average power ratio (PAPR), with and without PAPR reduction in accordance with the present disclosure (e.g., in a system incorporating a PAPR reduction architecture, as the one illustrated in FIG. 2, for example), to demonstrate impact of PAPR reduction in an example use scenario.

For example, as shown in FIG. 4A, diagram 400 includes lines 402 and 404, corresponding to the probability-vs-PAPR (with PAPR expressed in dBs) profiles without and with PAPR reduction optimization. In this regard, as illustrated in diagram 400, use of the PAPR reduction described above results in substantial improvement as the non-optimized CCDF line 402 has ~0.75 dB per decade slope whereas the PAPR optimized CCDF line 404 has <0.5 dB per decade slope.

Shown in FIG. 4B is diagram 410, which depicts a complementary cumulative distribution function (CCDF) for peak to average power ratio (PAPR), with and without PAPR reduction in another example use scenario (with different number of channels being sign-flipped).

For example, as shown in FIG. 4B, diagram 410 includes lines 412 and 414, corresponding to the probability-vs-PAPR (with PAPR expressed in dBs) profiles without and with PAPR reduction optimization, with the non-optimized CCDF line 412 having, again, ~0.75 dB per decade slope whereas the PAPR optimized CCDF line 414 having <0.25 dB per decade slope.

Shown in FIG. 4C is diagram 420 illustrating yet another example use scenario, including lines 422 and 424, corresponding to the probability-vs-PAPR (with PAPR expressed in dBs) profiles without and with PAPR reduction optimization, with the non-optimized CCDF line 422 having, again, ~0.75 dB per decade slope whereas the PAPR optimized CCDF line 424 having even better (less than line 414 in FIG. 4B) performance per decade slope.

Figure 5:
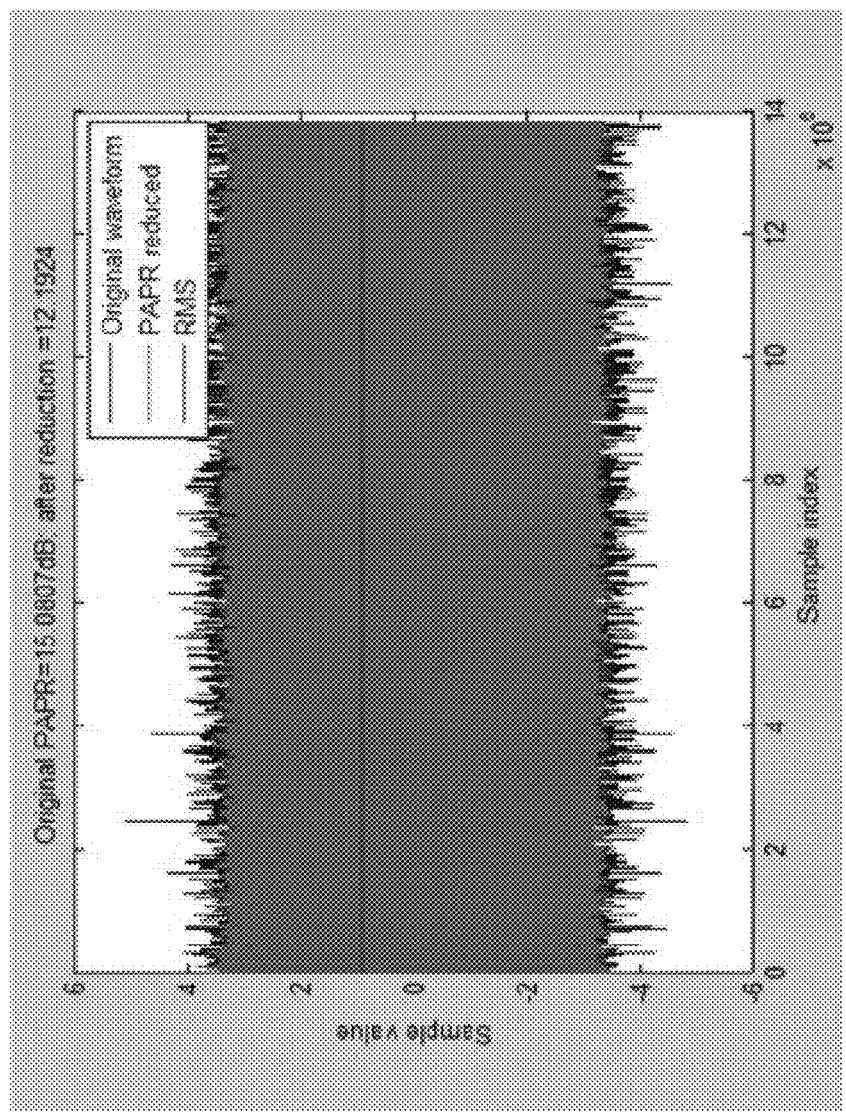
FIG. 5 illustrates improvement that may be achieved from use of average power ratio (PAPR) reductions in particular example use scenario.

FIG. 5 illustrates improvement that may be achieved from use of average power ratio (PAPR) reductions in particular example use scenario.

Shown in FIG. 5 is a diagram 500 representing a signal trace to demonstrate the improvement realized from an example use scenario of PAPR reduction in accordance with the present disclosure. In particular, with use of PAPR reduction based on sign-flipping at symbol boundaries a PAPR reduction of more than 2 dBs (close to 3 dB) is observed.

Figure 6:
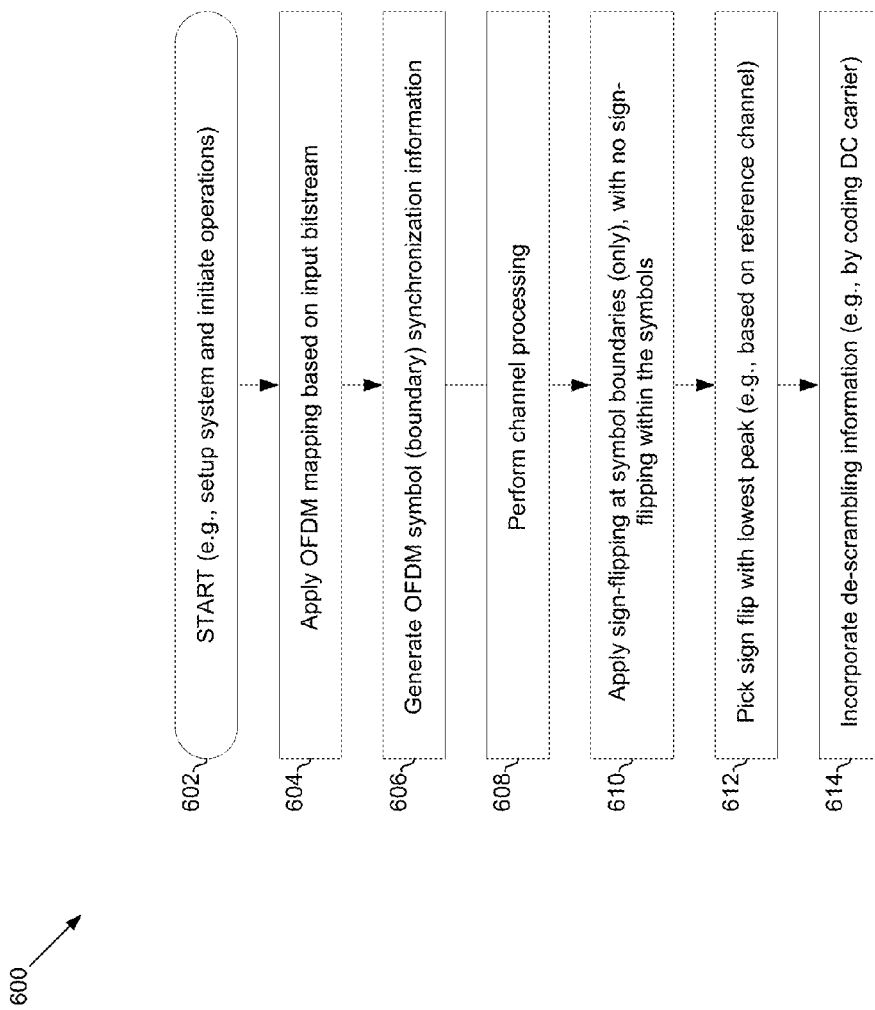
FIG. 6 illustrates a flowchart of an example process for peak to average power ratio (PAPR) reduction in multichannel digital front-ends (DFEs).

FIG. 6 illustrates a flowchart of an example process for peak to average power ratio (PAPR) reduction in multichannel digital front-ends (DFEs). Shown in FIG. 6 is flow chart 600, comprising a plurality of example steps (represented as blocks 602-6xx), which may be performed in a suitable system (e.g., the transmitter 200 of FIG. 2) to provide peak to average power ratio (PAPR) reduction.

In starting step 602, the system may be setup for operation.

In step 604, OFDM mapping may be applied, based on an input bitstream.

In step 606, OFDM symbol (boundary) synchronization information may be generating, to enable determining boundaries between symbols.

In step 608, channel processing may be performed.

In step 610, sign-flipping may be applied at symbol boundaries (only); with no sign-flipping within symbols.

In step 612, sign flip with lowest peak may be picked (e.g., based on reference channel).

In step 614, descrambling information may be incorporating into the transmission (e.g., by coding DC carrier), to enable descrambling at the receiver-side.

Other embodiments of the invention may provide a non-transitory computer readable medium and/or storage medium, and/or a non-transitory machine readable medium and/or storage medium, having stored thereon, a machine code and/or a computer program having at least one code section executable by a machine and/or a computer, thereby causing the machine and/or computer to perform the processes as described herein.

Accordingly, various embodiments in accordance with the present invention may be realized in hardware, software, or a combination of hardware and software. The present invention may be realized in a centralized fashion in at least one computing system, or in a distributed fashion where different elements are spread across several interconnected computing systems. Any kind of computing system or other apparatus adapted for carrying out the methods described herein is suited. A typical combination of hardware and software may be a general-purpose computing system with a program or other code that, when being loaded and executed, controls the computing system such that it carries out the methods described herein. Another typical implementation may comprise an application specific integrated circuit or chip.

Various embodiments in accordance with the present invention may also be embedded in a computer program product, which comprises all the features enabling the implementation of the methods described herein, and which when loaded in a computer system is able to carry out these methods. Computer program in the present context means any expression, in any language, code or notation, of a set of instructions intended to cause a system having an information processing capability to perform a particular function either directly or after either or both of the following: a) conversion to another language, code or notation; b) reproduction in a different material form.

While the present invention has been described with reference to certain embodiments, it will be understood by those skilled in the art that various changes may be made and equivalents may be substituted without departing from the scope of the present invention. In addition, many modifications may be made to adapt a particular situation or material to the teachings of the present invention without departing from its scope. Therefore, it is intended that the present invention not be limited to the particular embodiment disclosed, but that the present invention will include all embodiments falling within the scope of the appended claims.

What is claimed is:
1. A method comprising:
reducing peak-to-average-power ratio (PAPR) during multichannel transmission in a transmitter, the reducing comprising:
generating based on an input that is to be transmitted, a plurality of frequency-domain symbols, with each one of said plurality of frequency-domain symbols corre- sponding to a particular one of a plurality of subcarriers associated with said multichannel transmission;
assigning said plurality of subcarriers to a plurality of channels used for said multichannel transmission, wherein a number of said plurality of channels is less than a number of said plurality of subcarriers;
generating a plurality of time-domain signals corresponding to said plurality of channels; and
applying an adjustment to at least one of said plurality of time-domain signals, wherein said adjustment is based on boundaries between at least two of said frequency-domain symbols;
generating adjusted and unadjusted waveforms for two or more of said plurality of time-domain signals, wherein generating said adjusted waveforms comprises application of said adjustment to said two or more of said plurality of time-domain signals; and
selecting between the generated adjusted waveforms based on particular criteria.

2. The method of claim 1, wherein said adjustment comprises sign inversion.

3. The method of claim 1, wherein said multichannel transmission is based on orthogonal frequency division multiplexing (OFDM), and said plurality of frequency-domain symbols comprise OFDM symbols.

4. The method of claim 1, wherein said particular criteria comprises lowest peak, when said adjustment comprises sign inversion.

5. The method of claim 1, comprising communicating information relating to said PAPR reduction to enable handling, at receive-side, of an output corresponding to said plurality of time-domain signals.

6. The method of claim 5, wherein said information comprise sign descrambling related information, when said adjustment comprises sign inversion.

7. The method of claim 5, comprising providing said information by configuring one or more spare carriers associated with said plurality of channels.

8. A system comprising:
a transmitter configured for reducing peak-to-average-power ratio (PAPR) during multichannel transmission, said transmitter comprising:
an input processing circuit that is operable to generate, based on an input that is to be transmitted, a plurality of frequency-domain symbols, wherein each one of said plurality of frequency-domain symbols corresponds to a particular one of a plurality of subcarriers associated with said multichannel transmission; and
a multichannel processing circuit that is operable to:
assign said plurality of subcarriers to a plurality of channels used for said multichannel transmission, wherein a number of said plurality of channels is less than number of said plurality of subcarriers; and
generate a plurality of time-domain signals corresponding to said plurality of channels; and
a peak-to-average-power (PAPR) reduction circuit that is operable to:
apply an adjustment to at least one of said plurality of time-domain signals, wherein said adjustment is based on boundaries between at least two of said frequency-domain symbols;
generate adjusted and unadjusted waveforms for two or more of said plurality of time-domain signals, wherein generating said adjusted waveforms comprises application of said adjustment to said two or more of said plurality of time-domain signals; and
select between the generated adjusted waveforms based on particular criteria.

9. The system of claim 8, wherein said adjustment comprises sign inversion.

10. The system of claim 8, wherein said multichannel transmission is based on orthogonal frequency division multiplexing (OFDM), and said plurality of frequency-domain symbols comprise OFDM symbols.

11. The system of claim 8, wherein said particular criteria comprises lowest peak, when said adjustment comprises sign inversion.

12. The system of claim 8, wherein said transmitter is operable to communicate information relating to said PAPR reduction to enable handling, at receive-side, of an output corresponding to said plurality of time-domain signals.

13. The system of claim 12, wherein said information comprise sign descrambling related information, when said adjustment comprises sign inversion.

14. The system of claim 12, wherein said peak-to-average-power ratio (PAPR) reduction circuit is operable configure one or more spare carriers associated with said plurality of channels to provide said information relating to said PAPR reduction.

15. A system comprising:
a peak-to-average-power ratio (PAPR) reduction circuit operable to reduce peak-to-average-power ratio (PAPR) during multichannel transmission, said PAPR reduction circuit comprising:
a plurality of channel processing circuits, wherein:
each of the plurality of channel processing circuits is operable to process a corresponding one of a plurality time-domain signals;
each one of said plurality time-domain signals corresponds to a particular one of a plurality of channels associated with said multichannel transmission;
said plurality time-domain signals is generated based on assigning of a plurality of frequency-domain symbols to said plurality of channels; and
a number of said plurality of channels is less than a number of said plurality of frequency-domain symbols;
one or more signal adjustment circuits, wherein each one or more signal adjustment circuits is operable to apply an adjustment to an output of a corresponding one of said plurality of channel processing circuits, said adjustment being based on boundaries between at least two of said frequency-domain symbols; and
a selection circuit operable to select, when more than one of the signal adjustment circuits are used, between outputs of said one or more signal adjustment circuits, based on particular selection criteria.

16. The system of claim 15, wherein said multichannel transmission is based on orthogonal frequency division multiplexing (OFDM), and said plurality of frequency-domain symbols comprise OFDM symbols.

17. The system of claim 15, wherein said adjustment comprises sign inversion.

18. The system of claim 15, wherein said particular criteria comprises lowest peak, when said adjustment comprises sign inversion.

* * * * *